United States Patent [19]
Ishibashi

[11] Patent Number: 5,923,678
[45] Date of Patent: Jul. 13, 1999

[54] PATTERN DATA GENERATING SYSTEM

[75] Inventor: Manabu Ishibashi, Hyogo, Japan

[73] Assignees: Mitsubishi Electric System Lsi Design Corporation, Hyogo, Japan; Mitsubishi Denki Kabushiki Kaisha, Tokyo, Japan

[21] Appl. No.: 08/992,216

[22] Filed: Dec. 17, 1997

[30] Foreign Application Priority Data

Jul. 11, 1997 [JP] Japan ................................. 9-187043

[51] Int. Cl.$^6$ ........................................................ G06F 11/00
[52] U.S. Cl. ........................................................... 371/27.1
[58] Field of Search ................................. 371/27.1, 22.1, 371/22.35, 22.36, 22.4, 22.5, 22.6

[56] References Cited

PUBLICATIONS

"VLSI Electron Beam Data Verification and check system." Mitsubishi Denki Gihou, vol. 68, No. 3 (1994) pp. 86(288)–89(291).

*Primary Examiner*—Vincent P. Canney
*Attorney, Agent, or Firm*—Leydig, Voit & Mayer, Ltd.

[57] ABSTRACT

A pattern data generating system solves a problem of a conventional pattern data generating system in which the total processing time is prolonged. The present pattern data generating system includes a parallel processing number calculator for computing the number of parallel processes to be used by a region divider that sequentially distributes the split pattern data. A group of pattern data generators generate pattern data in parallel processes. A pattern data combiner combines the pattern data output from the pattern data generators. A parallel processing controller controls the processing.

4 Claims, 7 Drawing Sheets

PATTERN DATA GENERATING SYSTEM

BACKGROUND OF THE INVENTION

1. Field of the Invention

The present invention relates to a pattern data generating system for generating pattern data for an electron beam exposure system from layout pattern data in the process of fabricating semiconductor devices or the like.

2. Description of Related Art

The electron beam exposure has been widely used in the production of masks applied to the fabrication of semiconductor devices, particularly to the fabrication of large-scale integrated (LSI) circuits because of its good microprocessing performance and high controllability.

The electron beam exposure data used for the production of the masks are generated by converting layout pattern data into masking pattern data (referred to as "pattern data" from now on), followed by a plurality of complicated pattern data generation processes the input pattern data, such as fracture, overlap removal, tone reversal, and sorting.

FIG. 6 is a block diagram showing a configuration of a conventional pattern data generating system. In FIG. 6, the reference numeral 101 designates pattern data information; 102 designates a region divider; 103 each designate a first pattern data information storage for storing split pattern data information produced by the region divider 102; 104 designates a group of pattern data generators; 105 each designate a second pattern data information storage for storing the pattern data information having undergone the pattern data generation; 106 designate a pattern data combiner; 107 designates pattern data information formed by combining the output of the second pattern data information storages 105; and 108 designates a parallel processing controller.

Next, the operation of the conventional pattern data generating system will be described.

The conventional pattern data generating system simply splits the pattern data information 101 into four parts by the region divider 102 as illustrated in FIG. 7. The region divider 102 allocates the split pattern data information to the common pattern libraries 109, and has the first pattern data information storages 103 store them. Afterward, the pattern data generators 104 generate the pattern data information by performing the pattern data generation processing of the stored data, and the second pattern data information storages 105 store the pattern data information generated by the pattern data generators 104. The pattern data combiner 106 combines the data stored in the second pattern data information storages 105, and outputs the pattern data information 107.

With such a configuration, the conventional pattern data generating system simply splits the pattern data information into four parts by the region divider 102 so that the split data is processed in parallel. Hence, the split data can include different amounts of pattern data, which presents a problem of delaying the total processing time.

SUMMARY OF THE INVENTION

The present invention is implemented to solve the foregoing problem. It is therefore an object of the present invention to provide a pattern data generating system which can implement effective parallel processing by allocating substantially equal amounts of pattern data information to a plurality of parallel processing means prior to the parallel processings.

According to an aspect of the present invention, there is provided a pattern data generating system comprising: a plurality of pattern data generators for performing parallel processings on pre-processed pattern data and for producing post-processed pattern data; a region divider for dividing the pre-processed pattern data into a predetermined number of unit pattern regions; a parallel processing number calculator for computing a number of the pattern data generators to be operated in the parallel processings in accordance with an amount of available memory areas associated with the plurality of pattern data generators; a pattern data distributor for allocating the pattern data in the unit pattern regions to the plurality of pattern data generators to be operated in the parallel processings; a pattern data combiner for combining the post-processed pattern data output from the plurality of pattern data generators operated in the parallel processings; and a controller carrying out overall control of the pattern data generating system.

Here, the parallel processing number calculator may compute the number of the parallel processings by the following equation:

the number of parallel processings = the available memory areas/(maximum number of patterns in each pattern data region×memory area required for processing one pattern data).

The pattern data generating system may further comprise a calculator for computing a threshold figure number from a ratio of the number of parallel processings to a total number of patterns, wherein the pattern data distributor, counting a number of patterns allocated to one of the plurality of pattern data generators to be operated in the parallel processings, amy stop allocation of the pattern data in the pattern regions to that pattern data generator when its count value reaches the threshold figure number.

DETAILED DESCRIPTION OF THE PREFERRED EMBODIMENTS

The invention will now be described with reference to the accompanying drawings.

EMBODIMENT 1

Figure 1:
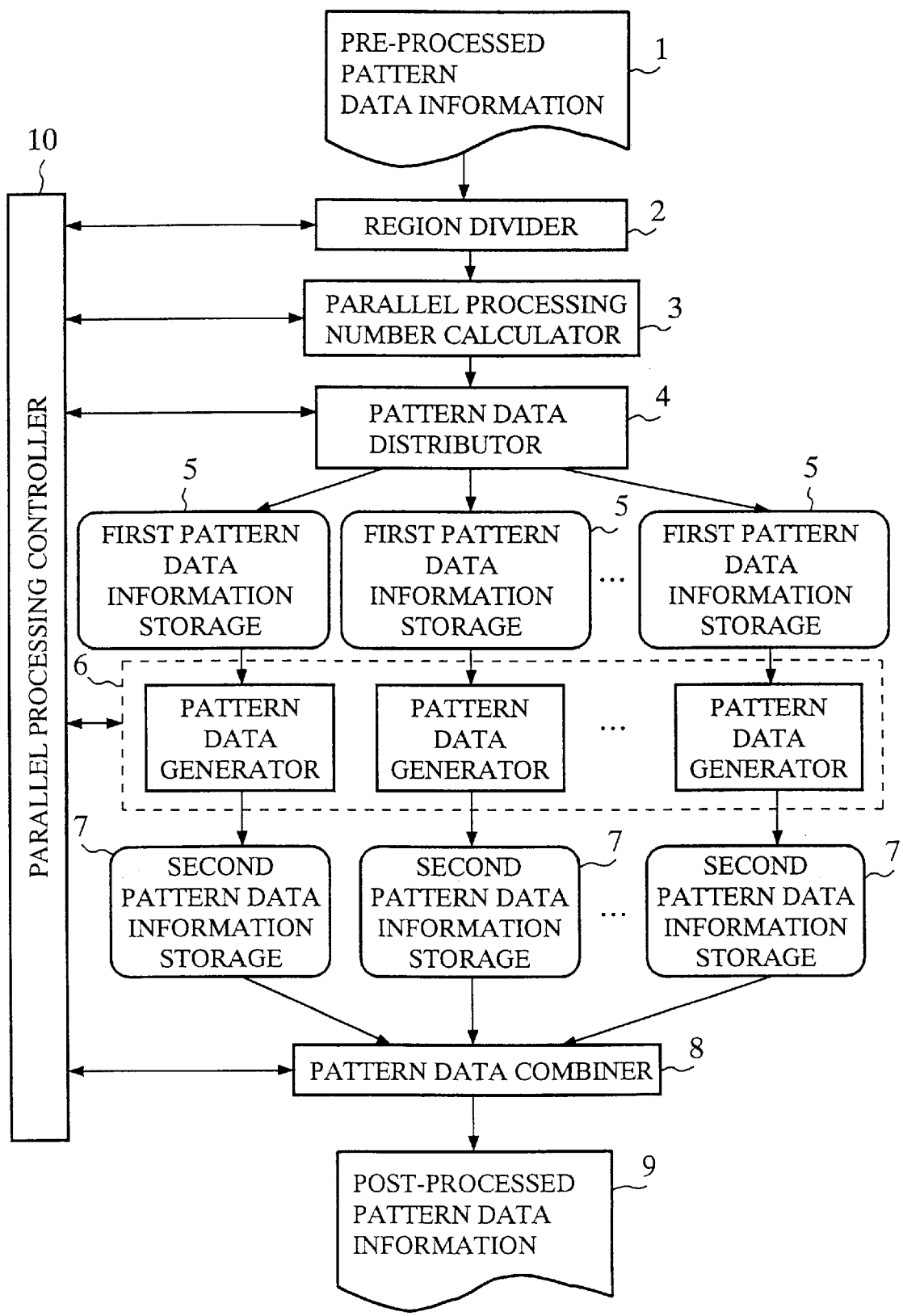
FIG. 1 is a block diagram showing an embodiment 1 of a pattern data generating system in accordance with the present invention.

FIG. 1 is a block diagram showing a configuration of an embodiment 1 of a pattern data generating system in accordance with the present invention. In FIG. 1, the reference numeral 1 designates pre-processed pattern data information; 2 designates a region divider; 3 designates a parallel processing number calculator; 4 designates a pattern data distributor; 5 each designate a first pattern data information storage for storing pattern data information distributed by the pattern data distributor 4; 6 designates a group of pattern data generators; 7 each designates a second pattern data information storage for storing the pattern data information having undergone the pattern data generation processing; 8 designates a pattern data combiner for combining the outputs of the second pattern data information storages 7; 9 designates post-processed pattern data information output from the pattern data combiner 8; and 10 designates a parallel processing controller for performing the overall control of the system. Each parallel processing portion consists of a CPU including the first pattern data information storage 5, pattern data generator 6 and second pattern data information storage 7. Thus, the CPUs operate in parallel.

Figure 3:
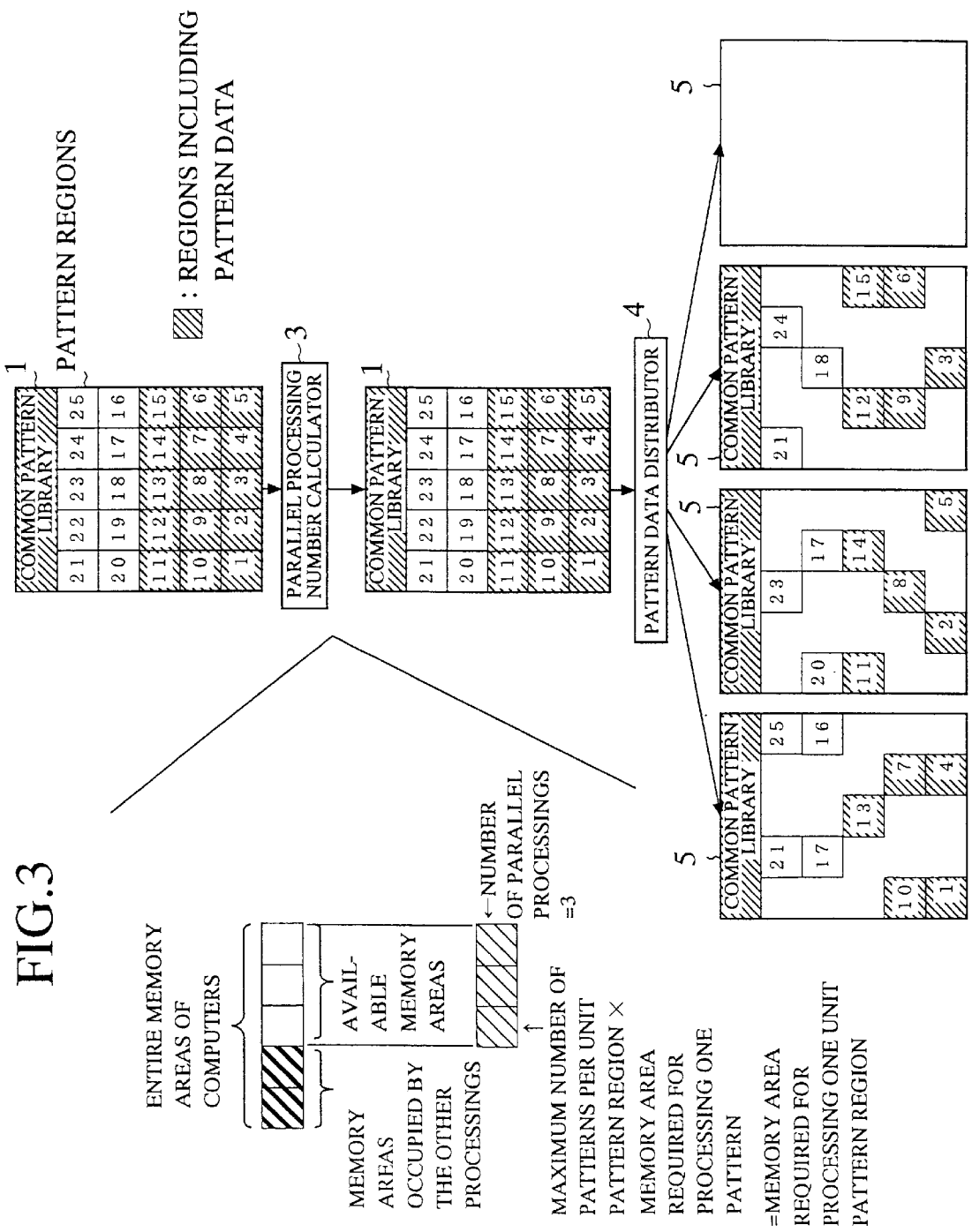
FIG. 3 is a diagram illustrating the distribution of the pattern data in the embodiment 1.
Figure 6:
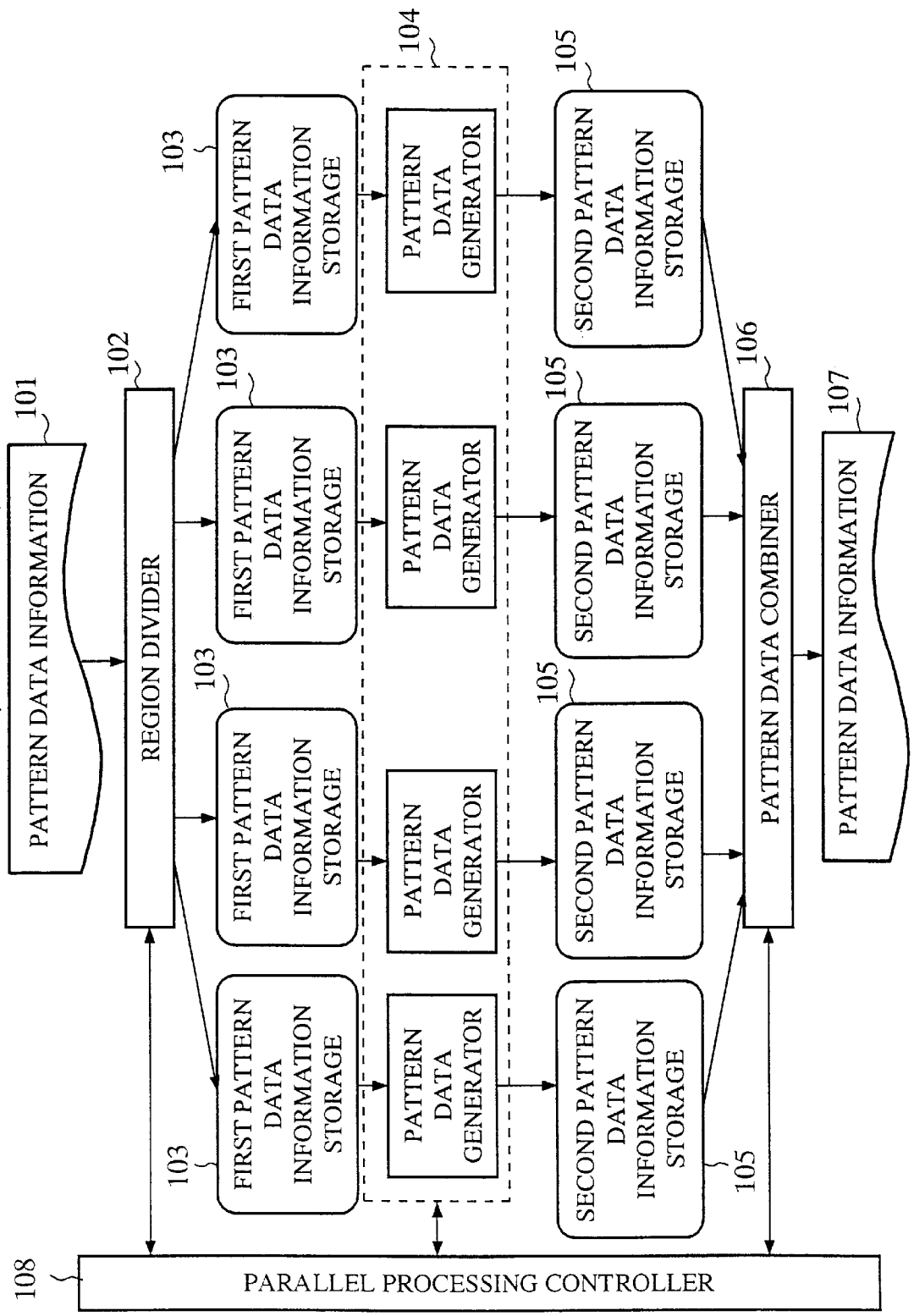
FIG. 6 is a block diagram showing a conventional pattern data generating system.
Figure 7:
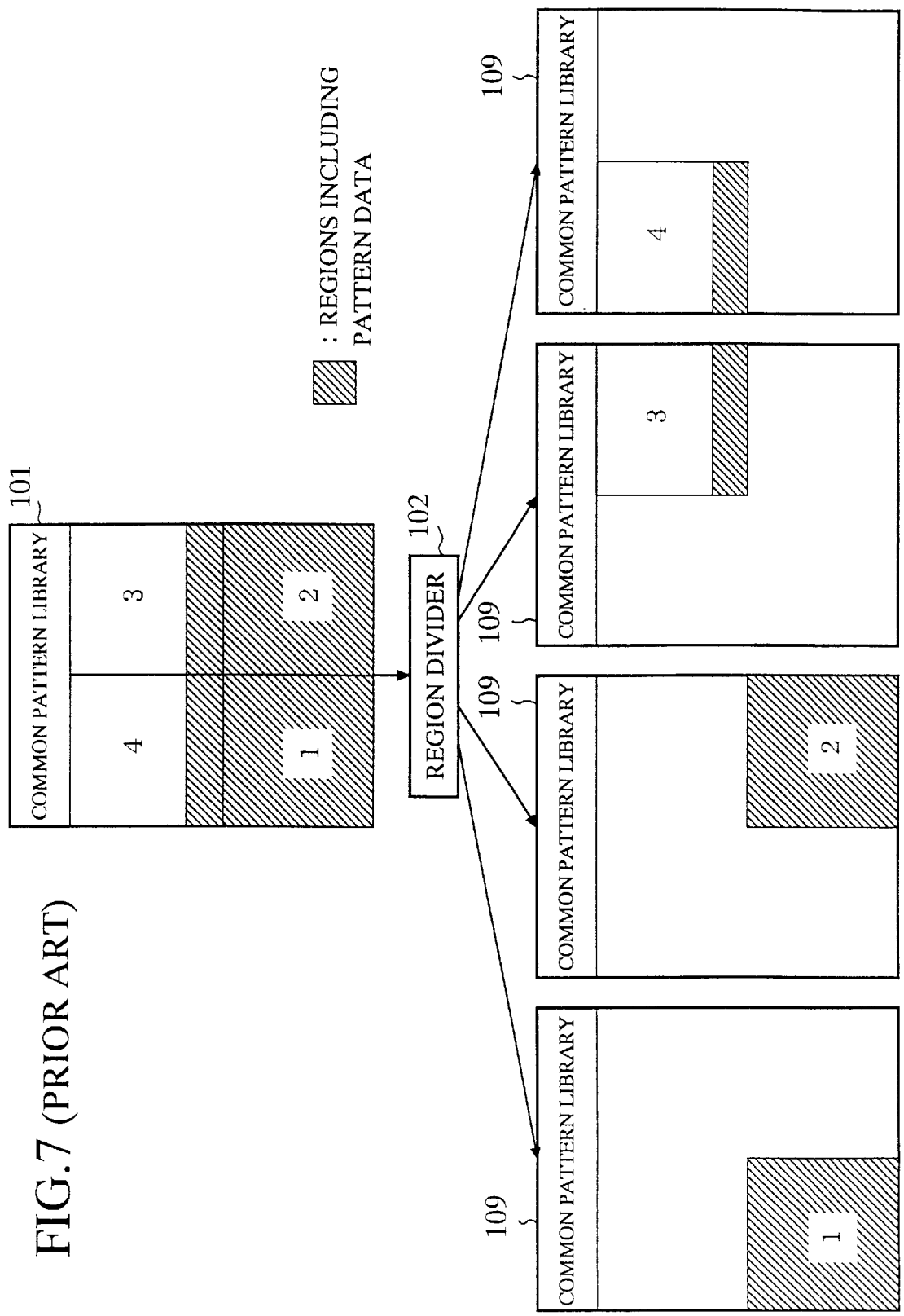
FIG. 7 is a diagram illustrating the distribution of the pattern data by the conventional pattern data generating system.

The embodiment 1 mainly differs from the conventional system as shown in FIG. 6 in that it comprises the parallel processing number calculator 3 and pattern data distributor 4, besides the operation of the region divider 2. The region divider 2 divides the pre-processed pattern data information 1 into unit pattern regions 1–25 of a predetermined dimension as shown in FIG. 3. For example, a chip of a few square millimeter is split into the unit pattern regions, each of which is about 0.1 square millimeter.

The parallel processing number calculator 3 computes the number of parallel processings executed by the parallel CPUs including the pattern data generators 6 in accordance with the total amount of available memory areas in the memories of the parallel CPUs as shown in FIG. 3. The number of parallel processing N can be computed by the following equation (1), for example.

$$N = A/B = A/(C \times D) \tag{1}$$

where A is the total amount of the available memory areas, B is the memory area needed for processing one unit pattern region, C is a maximum number of patterns per unit pattern region, and D is a memory area needed for processing one pattern, where B, C and D are fixed values determined from the pattern data.

The pattern data distributor 4 distributes the unit pattern regions as shown in FIG. 3 to the first pattern data information storages 5 whose number equals the number of the parallel processings which is three in this case. Then, the pattern data distributor 4 copies the common library to the respective first pattern data information storages 5.

Next, the operation will be described.

Figure 2:
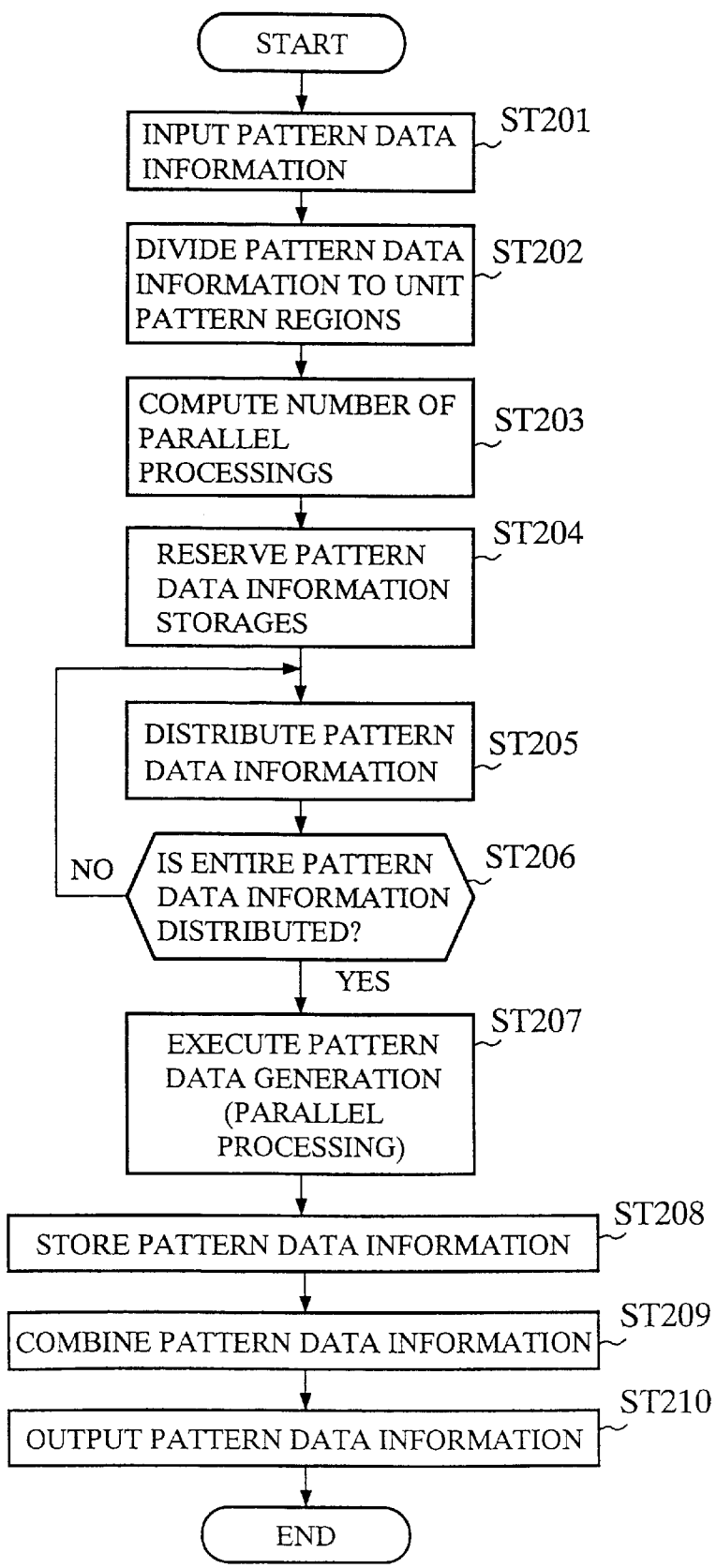
FIG. 2 is a flowchart illustrating the operation of the embodiment 1.

FIG. 2 is a flowchart illustrating the operation of the present embodiment 1 of the pattern data generating system with the foregoing configuration. First, the pre-processed pattern data information 1 is input to the region divider 2 at step ST201. Subsequently, the region divider 2 divides the pre-processed pattern data information 1 into unit pattern regions 1–25, each having a predetermined dimension at step ST202. For example, the size of the unit pattern region is determined at about 0.1 square millimeter for a chip of a few square millimeter. The parallel processing number calculator 3 computes the number of the parallel processing using the foregoing equation (1) as shown in FIG. 3 at step ST203.

The pattern data distributor 4 reserves, as shown in FIG. 3, the first pattern data information storages 5 by the number of the parallel processing computed by the parallel processing number calculator 3 at step ST204, and transfers the common pattern library to each of them. Then, the pattern data distributor 4 sequentially distributes the pattern data information in the unit pattern regions 1–25 to the first pattern data information storage 5 at step ST205. If a decision is made at step ST206 that the pattern data distributor 4 has completed the distribution of the entire pattern data information, each pattern data generator 6 executes at step ST207 the parallel processing of the pattern data stored in the first pattern data information storage 5 beginning from the unit pattern regions 1, 2 and 3, followed by the next unit pattern regions 4, 5 and 6, and so on. After completing the pattern data generation, the pattern data generators 6 store the resultant pattern data information in the second pattern data information storages 7 at step ST208. Subsequently, the pattern data combiner 8 combines the pattern data information stored in the second pattern data information storages 7 at step ST209 to generate the post-processed pattern data information 9 at step ST210. The foregoing steps are controlled by the parallel processing controller 10.

Thus, the embodiment 1 allocates the pattern data to the second pattern data information storages 7 reserved by the number of the parallel processings computed in accordance with equation (1). This makes it possible to optimize the number of parallel processings leading to the effective use of the computer resources.

In addition, since the numbers of the pattern data of the first pattern data information storages 5 are made even by sequentially distributing the pattern data to them on the unit pattern region basis in the stage previous to the parallel processing, they are equally allocated to the CPUs executing the parallel processing.

EMBODIMENT 2

Figure 5:
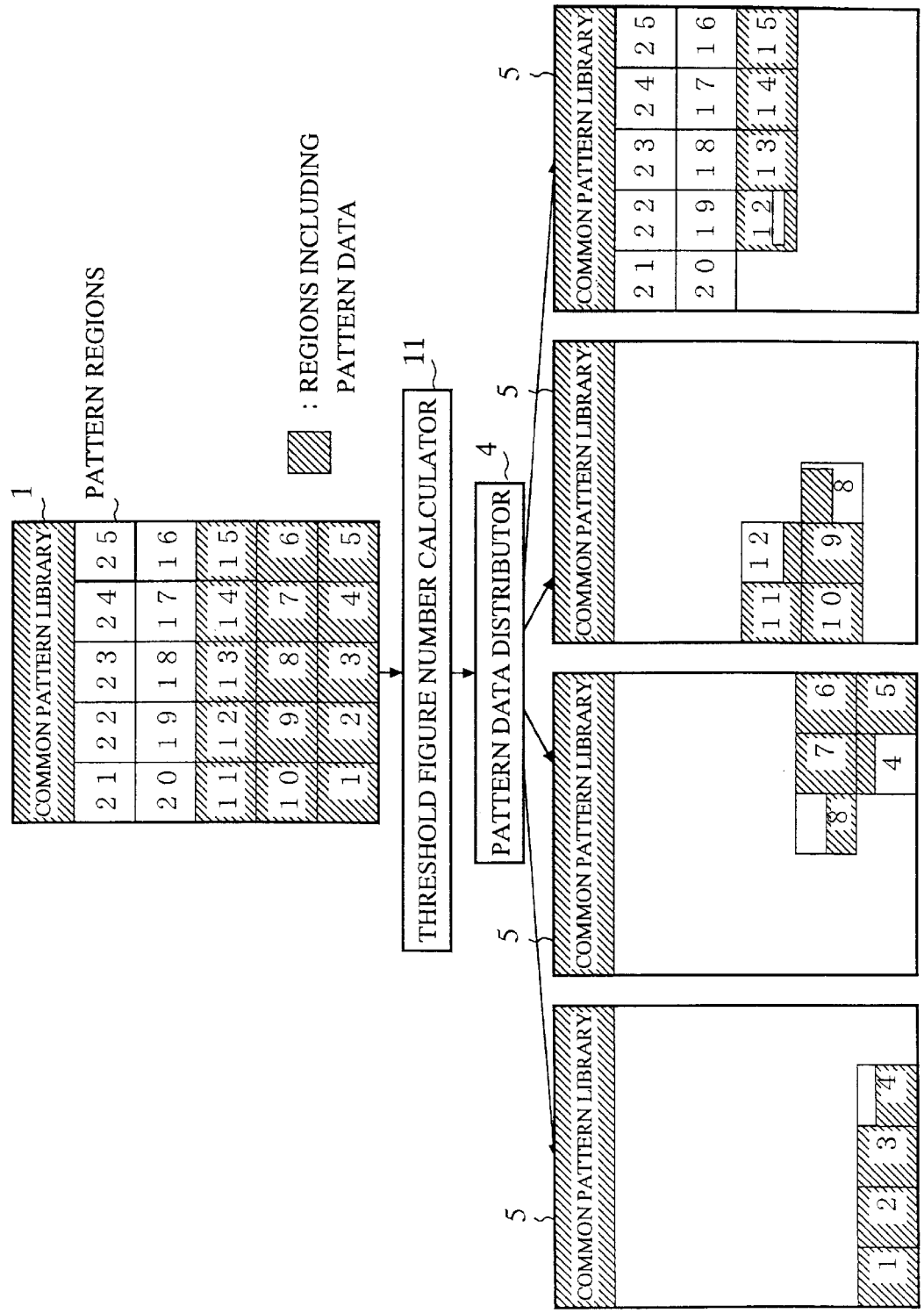
FIG. 5 is a diagram illustrating the distribution of the pattern data in the embodiment 2.

FIG. 5 is a diagram illustrating the distribution of the pattern data in an embodiment 2 of the pattern data generating system in accordance with the present invention. Although the embodiment 1 sequentially distributes the pattern data information on the unit pattern region basis, there are some variations in the number of the pattern data because it varies to some extent among the unit pattern regions.

In view of this, the present embodiment 2 interposes a threshold figure number calculator 11 between the parallel processing number calculator 3 and the pattern data distributor 4 as shown in FIG. 5. The threshold figure number calculator 11 computes a threshold figure number F for distributing the pattern data information by the following equation (2).

$$F = P/N$$

where P is the total number of the pattern data, and N is the number of parallel processings determined by equation (1).

The pattern data distributor 4 distributes the pattern data to the first pattern data information storages 5 in accordance with the threshold figure number F as illustrated in FIG. 5. More specifically, the pattern data distributor 4 counts the number of pattern data during the distribution, and stops the data allocation to the first pattern data information storage 5 when the number become equal to the threshold figure number F. The remaining pattern data information is allocated to the other first pattern data information storages 5 in the same manner. Thus, the pattern data distributor 4 can allocate the pattern data information to the first pattern data information storages 5 more evenly than its counterpart in FIG. 1.

Figure 4:
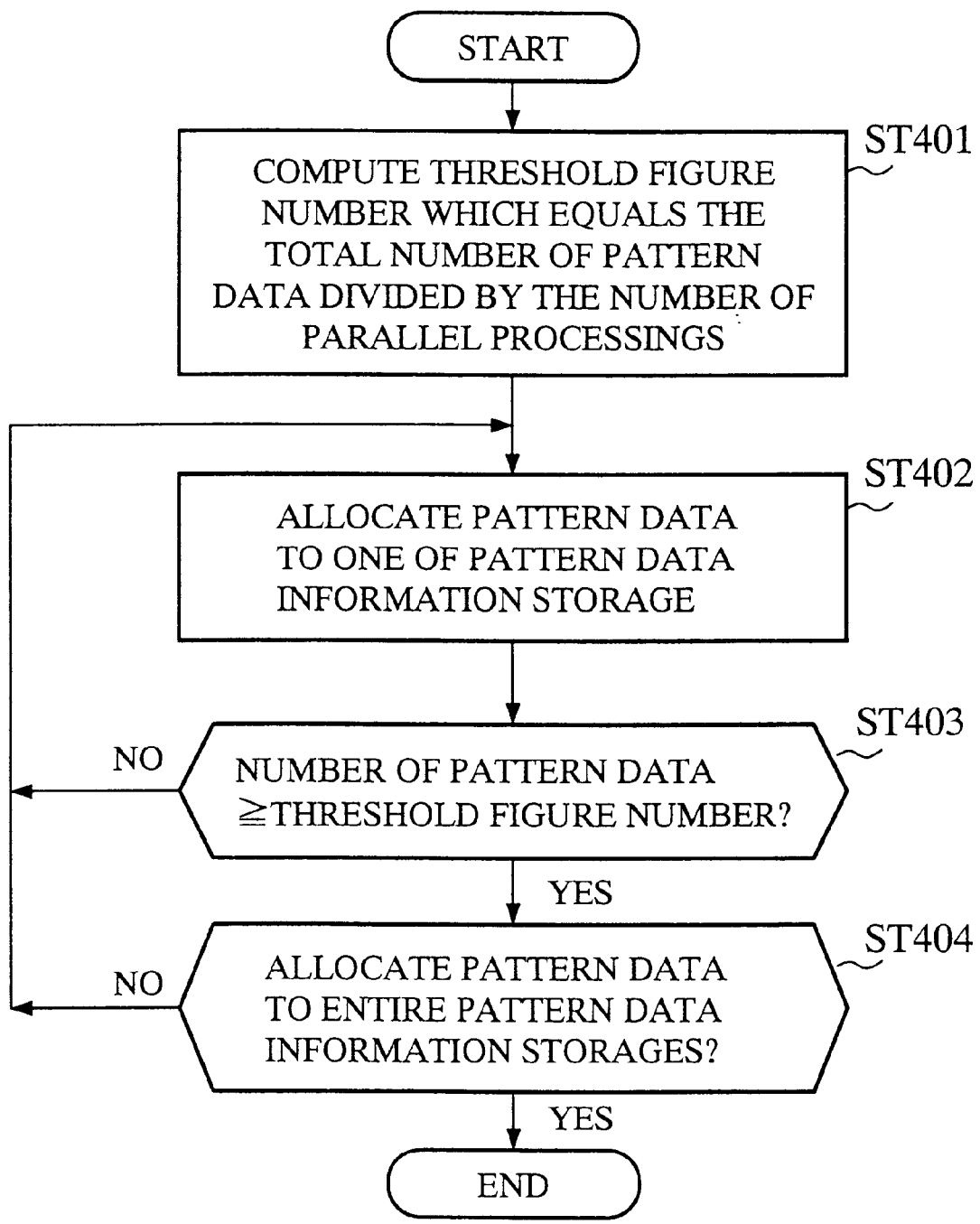
FIG. 4 is a flowchart illustrating the operation of an embodiment 2 of the pattern data generating system in accordance with the present invention.

FIG. 4 is a flowchart illustrating the operation of the pattern data distributor 4 in the present embodiment 2. These steps ST401–ST404 are carried out instead of the foregoing step ST205 in FIG. 2.

First, the threshold figure number calculator 11 computes the threshold figure number F by the foregoing equation (2). Subsequently, allocating the pattern data to one of the first pattern data information storages 5 at ST402, the pattern data distributor 4 counts the number of pattern data allocated to that first pattern data information storage 5, and stops the allocation when the number of the allocated pattern data reaches the threshold figure number F at step ST403. The pattern data distributor 4 continues the allocation for all the remaining first pattern data information storages 5 at steps ST402–ST404, thus distributing the pattern data evenly at higher accuracy than the pattern data distributor 4 of the embodiment 1.

Thus, the present embodiment 2 can allocate the pattern data more accurately to the first pattern data information storages 5 than the embodiment 1 by splitting the pattern data information in accordance with the threshold figure number F.

What is claimed is:

1. A pattern data generating system comprising:

a plurality of pattern data generators for parallel processing of pre-processed pattern data and producing post-processed pattern data;

a region divider for dividing the pre-processed pattern data into a number of unit pattern regions;

a parallel processing number calculator for computing how many of said pattern data generators are operated in the parallel processing in accordance with the pre-processed pattern data in the unit pattern regions and available memory areas associated with said plurality of pattern data generators;

a pattern data distributor for allocating the pre-processed pattern data in the unit pattern regions to said pattern data generators to be operated in the parallel processing;

a pattern data combiner for combining the post-processed pattern data output from said pattern data generators operated in the parallel processing; and a controller for controlling the pattern data generating system.

2. The pattern data generating system as claimed in claim 1, wherein said parallel processing number calculator computes the number of parallel processes to be performed by said pattern data generators as the available memory areas/(a maximum number of patterns in a unit pattern region× memory area required for processing one pattern data).

3. The pattern data generating system as claimed in claim 1, comprising a calculator for computing a threshold from a ratio of the total number of patterns to the number of parallel processes to be performed by the pattern data generators, wherein said pattern data distributor counts the patterns allocated to one of said plurality of pattern data generators, stops allocation of the pattern data in the unit pattern regions to a pattern data generator when its count reaches the threshold.

4. The pattern data generating system as claimed in claim 2, comprising a calculator for computing a threshold from a ratio of the total number of patterns to the number of parallel processes to be performed by the pattern data generators, wherein said pattern data distributor counts the patterns allocated to one of said plurality of pattern data generators, stops allocation of the pattern data in the unit pattern regions to a pattern data generator when its count reaches the threshold.

* * * * *